United States Patent [19]
Moog

[11] 4,280,387

[45] Jul. 28, 1981

[54] FREQUENCY FOLLOWING CIRCUIT

[75] Inventor: Robert A. Moog, Leicester, N.C.

[73] Assignee: Norlin Music, Inc., Deerfield, Ill.

[21] Appl. No.: 14,940

[22] Filed: Feb. 26, 1979

[51] Int. Cl.[3] ........................ G10H 1/00; H04M 1/00; G01R 23/02

[52] U.S. Cl. .................................. 84/1.01; 179/1 SA; 324/78 J; 324/78 F; 84/454; 84/DIG. 18

[58] Field of Search ................ 84/1.01, DIG. 18, 454; 324/78 J, 78 F, 78 R, 79 R, 79 D; 179/15 A, 15 C

[56] References Cited

U.S. PATENT DOCUMENTS

| | | | |
|---|---|---|---|
| 2,901,699 | 8/1959 | Motz et al. | 84/454 |
| 3,476,863 | 11/1969 | Campbell | 84/1.01 |
| 3,488,518 | 1/1970 | Taylor | 307/246 |
| 3,591,699 | 7/1971 | Cutler | 84/1.11 |
| 3,603,738 | 9/1971 | Focht | 179/1 SC |
| 3,704,414 | 11/1972 | Herbst | 324/79 D |
| 3,740,476 | 6/1973 | Atal | 179/1 SC |
| 3,810,067 | 5/1974 | Heidecker | 328/164 |
| 3,848,586 | 11/1974 | Suzuki | 128/2.1 B |
| 3,852,535 | 12/1974 | Zurcher | 179/1 SA |
| 3,895,553 | 7/1975 | Kawamoto | 84/1.24 |
| 3,911,776 | 10/1975 | Beigel | 84/1.11 |
| 4,028,985 | 6/1977 | Merritt | 324/78 R |
| 4,044,309 | 8/1977 | Smith | 179/1 SC |
| 4,070,618 | 1/1978 | Thomas | 324/79 D |
| 4,073,209 | 2/1978 | Whittington et al. | 84/1.01 |
| 4,151,775 | 5/1979 | Merriman | 84/1.01 |
| 4,160,402 | 7/1979 | Schwartz | 84/1.26 |
| 4,195,544 | 4/1980 | Kolke | 84/1.19 |

OTHER PUBLICATIONS

Dobkin, "Op Amp Circuit Collection", in Linear Applications, vol. 1, (National Semiconductor), Feb. 1970, p. AN31-12.

*Primary Examiner*—J. V. Truhe
*Assistant Examiner*—Forester W. Isen
*Attorney, Agent, or Firm*—Allegretti, Newitt, Witcoff & McAndrews

[57] ABSTRACT

A plurality of a signal peak detection circuits connected in cascade for operation on a complex waveform input signal, for generating a reference signal having peaks occurring in time with the peaks of the fundamental frequency component of the input signal. The reference signal is processed for producing a voltage proportional to the period between successive signal peaks, which voltage is successively stored and monitored at select times for comparison of the relative magnitude changes in the voltage, for updating an output control voltage.

17 Claims, 1 Drawing Figure

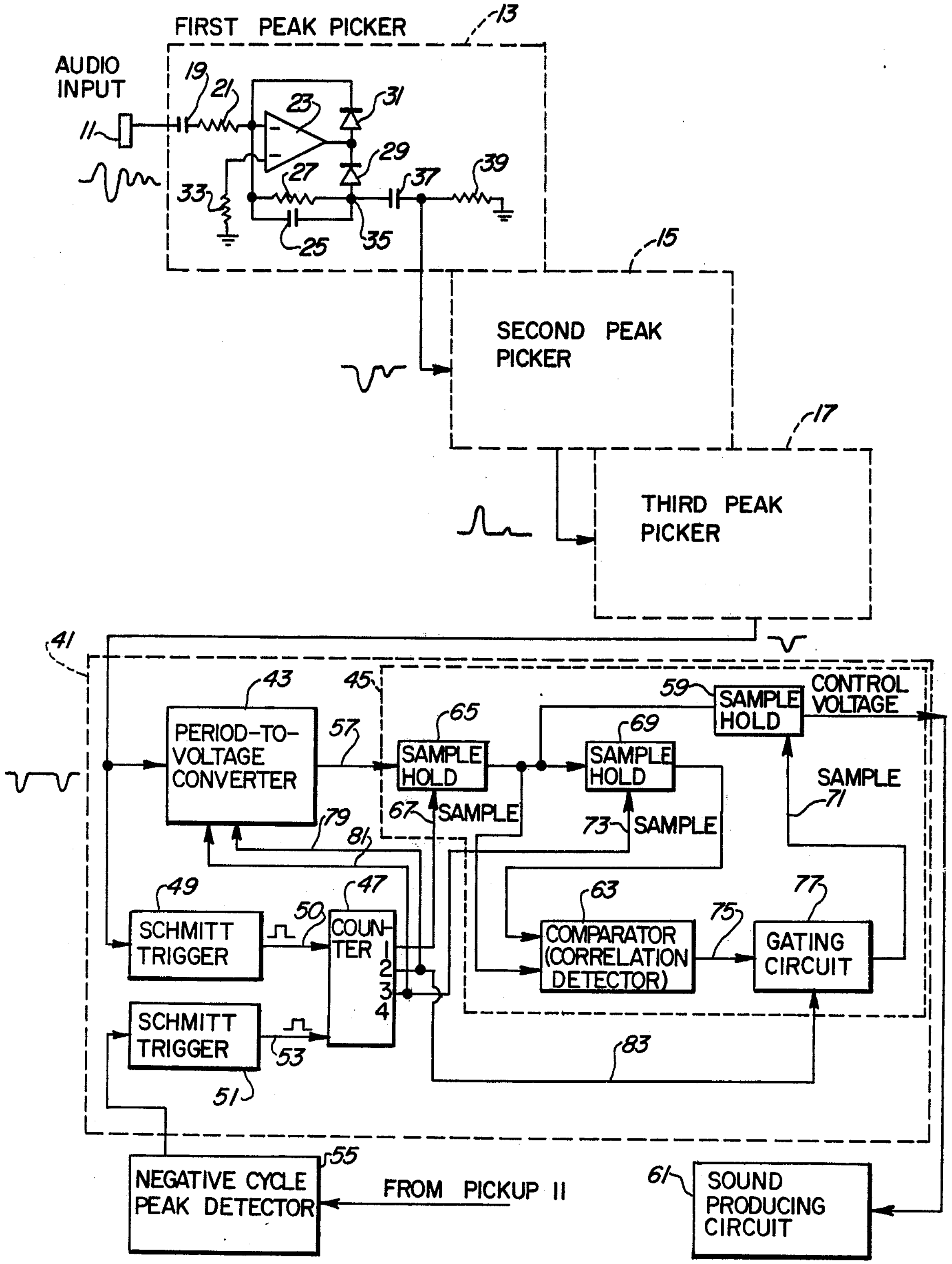
FIRST PEAK PICKER
13
AUDIO INPUT
11
19
21
23
31
29
27
33
37
39
25
35
15
SECOND PEAK PICKER
17
THIRD PEAK PICKER
41
43
45
PERIOD-TO-VOLTAGE CONVERTER
57
59
SAMPLE HOLD
CONTROL VOLTAGE
65
SAMPLE HOLD
69
SAMPLE HOLD
67
SAMPLE
73
SAMPLE
SAMPLE
71
79
81
49
SCHMITT TRIGGER
50
47
COUNTER
1
2
3
4
63
COMPARATOR (CORRELATION DETECTOR)
75
77
GATING CIRCUIT
SCHMITT TRIGGER
53
51
83
55
NEGATIVE CYCLE PEAK DETECTOR
FROM PICKUP 11
61
SOUND PRODUCING CIRCUIT

FREQUENCY FOLLOWING CIRCUIT

BACKGROUND OF THE INVENTION

The invention relates to electronic music generation and, more particularly, to a frequency following circuit for deriving a control voltage proportional to the fundamental frequency (pitch) of a periodic input signal of a complex waveform.

An electrical circuit which produces a control voltage which follows the fundamental frequency of an electrical input signal, generated, for example, by a musical sound wave, may be utilized to determine the frequencies of one or more appropriately scaled voltage controlled-oscillators. The oscillators may be connected to drive musical sound producers so that the frequencies of the oscillators retain a fixed musical interval relationship with respect to the input signal.

When using such a frequency following circuit for musical purposes, it is desirable that the frequency control voltage be derived as soon as possible upon input of the musical signal. Changes in the frequency of the musical signal should create corresponding changes in the control voltage with a minimum delay. If the delay is too long, the listener will receive a disturbing time lag between the change in pitch of the input signal and the change in pitch of the output of the voltage-controlled oscillators.

Also, it is desirable that the control voltage should not change in response to random changes in the input signal, that is, the control voltage should not respond to noise such as the breathy starting transient of a wind instrument tone.

The problem presented in deriving a control voltage proportional to the pitch of the musical tone of complex waveform, is the preparation of the wave form so that its fundamental frequency can be extracted. The prior art has employed a method wherein the input signal is passed through one or more low pass filters which attenuate the higher harmonics of the signal faster than the filters attenuate the fundamental frequency. This scheme has the disadvantage that it introduces a time delay in the output by virtue of the phase shift of the low pass filters. It also boosts line hum and other unwanted low frequency signals.

SUMMARY OF THE INVENTION

It is, therefore, an object of the present invention to provide an improved frequency following circuit which does not utilize low pass filters.

It is another object of the present invention to provide a novel frequency following circuit which provides noise discrimination.

These and other objects of the invention are achieved by converting a complex input signal to a signal bearing a reference point in each cycle of the fundamental frequency component of the input signal. The reference points of the converted signal are utilized to generate a voltage proportional to the period of the fundamental frequency component, which voltage is monitored at select times for relative magnitude changes in order to update a voltage output representative of the fundamental frequency of the input signal.

BRIEF DESCRIPTION OF THE DRAWINGS

The single FIGURE is a partial electrical schematic and block diagram of a preferred circuitry embodiment of the present invention.

DESCRIPTION OF THE PREFERRED EMBODIMENT

Referring to the single FIGURE, an electromagnetic or other direct pickup 11 transduces an aural signal, or the like, into an electrical signal of complex waveform which includes a fundamental frequency component plus a plurality of harmonic components. The signal is fed from pickup 11 successively through three peak pickers 13, 15, 17 for detection of the highest peak in each cycle. As will suggest itself from the following description, one or more peak pickers may be utilized in place of the three illustrated in the single FIGURE.

Each peak picker is comprised of like circuit components as illustrated by peak picker 13. A series-connected capacitor 19 and resistor 21 connect pickup 11 to the inverting input of an operational amplifier (op amp) 23. A parallel-connected capacitor 25 and resistor 27 connect the inverting input of op amp 23 to the op amp output via the anode-cathode junction of a diode 29. A second diode 31 has its cathode-anode junction connected directly between the inverting input and the output of op amp 23. The non-inverting input of op amp 23 is connected to ground via a resistor 33.

A circuit node 35 located at the junction between the anode of diode 29 and resistor 27 is connected to ground via a series-connected circuit of a capacitor 37 and a resistor 39. The signal developed at the junction between capacitor 37 and resistor 39 is fed as an input to the second peak picker 15.

During the positive portion of the input signal at peak picker 13, the output of op amp 23 goes negative and capacitor 37 charges very rapidly providing a negative voltage level at node 35. As the input signal increases in magnitude, op amp 23 forces the voltage at node 35 to maintain a fixed voltage relationship with the voltage appearing at the inverting input of op amp 23, for producing a current through resistor 27 substantially equal to the current through resistor 21. When the positive portion of the input signal has peaked and begins decreasing in magnitude, the voltage at junction node 35 becomes more negative than necessary to provide proper feedback voltage and capacitor 37 discharges at a slow time constant rate through resistor 27 and diode 31.

During the negative portion of the input signal to peak picker 13, op amp 23 produces a positive output and diode 31 conducts. A relatively insubstantial voltage drop appears across resistor 39, the effect of which is relatively negligible on the voltage output of the peak picker.

The voltage output of the peak picker is substantially proportional to the current charging capacitor 37. The magnitude of the charging current is a function of the rate of increase (slope) of the positive portion of the input signal. The peaks in the voltage output occur during charging of the capacitor, whereas the valleys between peaks occur during discharge of the capacitor and during the negative portion of the input signal. Thus, the output signal carries an indication of the occurrence of the positive peaks of the input signal.

The effective operation of the peak picker is to generate an output waveform which represents a sharpening of the positive peaks of the input signal and an exaggeration of the difference in height between the highest and lower positive peaks. Thus, with a periodic waveform appearing at pickup 11, the use of three or four such peak pickers in cascade will effectively suppress all but the highest peak of each cycle, passing the fundamental frequency component of the complex waveform.

Capacitor 25 of the peak picker serves to keep the circuit from oscillating by reducing the gain of op amp 23 at high frequencies, and resistor 33 serves to supply an input voltage at the noninverting input of op amp 23. The following pertinent circuit component values are given as illustrative of an operative preferred embodiment:

| | | |
|---|---|---|
| Capacitor | 19 | .22 microfarads |
| Resistor | 21 | 15 kilo ohms |
| Op Amp | 23 | operation Amplifier No. 4558 |
| Capacitor | 25 | 500 picofarads |
| Resistor | 27 | 33 kilo ohms |
| Capacitor | 37 | .22 microfarads |
| Resistor | 39 | 330 ohms |

Since the output of peak picker 13 is formed of negative voltage peaks, diodes 29, 31 of peak picker 15 have their respective anode and cathode connections interchanged for detection of negative going peaks in the input signal to peak picker 15. The output signal of peak picker 17 is a signal formed of peaks occurring substantially in time with the peaks of the fundamental component of the input signal. The peaks of the output signal of picker 17 serve as a reference point in each cycle of the fundamental frequency of the input signal.

The successive peaks are transmitted from the third peak picker 17 to a converting circuit 41 for deriving a control voltage output proportional to the period between successive peaks. Converting circuit 41 discriminates against noise and random variations in the period by monitoring the relative change in magnitude of the period at selected times, and updating the control voltage output accordingly.

Converting circuit 41 includes a period-to-voltage converter 43, an output circuit 45, and a counter 47 which controls the operation of circuit 41. Counter 47 is driven by a Schmitt trigger 49 which receives the periodic peak signals from peak picker 17 and produces a counting pulse in sync with each received peak. The counting pulses are fed to counter 47 along a lead 50.

In order for counter 47 to count twice for each full cycle, a Schmitt trigger 51 generates another counting pulse along a lead 53, occurring in time between each counting pulse generated by Schmitt trigger 49. In the preferred embodiment, Schmitt trigger 51 receives an input signal from a negative cycle peak detector 55 which is comprised of three cascaded peak detectors, each similar to peak pickers 13, 15, 17 except that diodes 29, 31 of each picker are reversed in direction, in order for the cascaded peak pickers to detect the negative peaks of the input signal from pickup 11.

Period-to-voltage converter 43 receives successive input peak signals from peak picker 17 and using each peak as a reference point in each cycle, converts the period between successive peaks to a proportional voltage level output along an output lead 57 to output circuit 45. As the period changes, the voltage level generated by period-to-voltage converter 43 will change accordingly.

One of the successive voltage outputs generated by period-to-voltage converter 43 is stored in a sample-hold circuit 59 of output circuit 45, for providing a control voltage output to a conventional sound producing circuit 61 which responds to the magnitude of the control voltage by producing an associated musical note. The voltage stored in sample-hold circuit 59 is updated by output circuit 45; a comparator 63 of the output circuit correlates the magnitude of successive voltage levels produced by the period-to-voltage converter for controlling the update function.

Period-to-voltage converter 43 produces a voltage which is proportional to the period between peaks in a conventional manner by generating a ramp voltage signal beginning at one peak and ending at the next peak. A charging of a capacitor is utilized to generate the ramp voltage during one complete cycle. During the following half cycle the charging is discontinued permitting the capacitor voltage to be sampled. During the next half cycle the capacitor is discharged. Thus, the period of every other full cycle is converted to a voltage level representative of the period between its respective peaks.

Lead 57 is connected to the input of a sample-hold circuit 65 which in response to a store command placed along its sample lead 67 stores the period voltage developed at its input from lead 57. The voltage stored by sample-hold circuit 65 is fed to the input of sample-hold circuit 59 and to the input of a third sample-hold circuit 69. Sample-hold circuits 59, 69 store the voltage appearing at their inputs responsive to a control signal placed along their respective sample leads, 71, 73.

The voltages stored in sample hold circuits 65, 69, are fed to voltage comparator 63 for comparison of the stored voltages. Comparator 63 determines whether successive periods, as represented by the stored voltages, lie within a certain small percentage of one another and produces a logic output along a lead 75 indicative of the determination. Comparator 63 may comprise a conventional window comparator which produces a logic output whenever its inputs are a certain percentage of one another.

Lead 75 is connected to a gating circuit 77 for gating the output of comparator 63 onto sample lead 71. If the correlation by comparator 63 indicates that the two period voltages fall within the preset range, then sample-hold circuit 59 is actuated along lead 71 for updating the voltage stored in circuit 59 with the period voltage stored in sample-hold circuit 65.

Thus, only when there is a close correlation between successive period voltages is the control voltage output as stored in sample hold circuit 59 permitted to change for updating the output of the system.

Counter 47 controls both the generation of the period voltage and the updating of the control voltage output. Command signals are generated on half cycles as the counter counts through the first three of its four separate count outputs.

A pair of counter output leads 79, 81 transmit command signals on count two and count three, respectively, to period-to-voltage converter 43 for controlling capacitor charging and discharging within converter 43. Sample lead 67 of sample-hold circuit 65 is connected to the counter for receiving a command signal on count one.

On count three, the timing capacitor of converter 43 is permitted to charge. One full cycle later on count one, the voltage on the timing capacitor is stored in sample hold circuit 65. One half cycle later on count two the timing capacitor is discharged to make ready for the next charging cycle. As will suggest itself, the charging of the capacitor may be discontined responsive to a count one command signal.

Counter 47 controls the updating of the control voltage output, by generating command signals along sample lead 73 and along a gating lead 83 which controls gating circuit 77. Command signals are generated along leads 73, 83 on count three and count two respectively, for commanding update of the period voltage.

On count three, sample-hold circuit 69 stores the immediate period voltage as stored in sample-hold circuit 65. One cycle later on count one, a new period voltage is stored in sample-hold circuit 65 and comparator 63 compares the new period voltage with the prior period voltage. On count two, the new period voltage is stored in sample-hold circuit 59 according to the output of comparator 63 via operation of gating circuit 77.

By using three sample-hold circuits 59, 65, 69, initial storage of the control voltage in sample-hold circuit 59 is delayed by comparator 63 during the start of a new note by the musician until the tone assumes a definite pitch. Thus, a control voltage will not be produced in response to noise such as the breathy starting transient prevalent with wind instruments.

It should be understood, of course, that the foregoing disclosure relates to a preferred embodiment of the invention and that other modifications or alterations may be made therein without departing from the spirit or scope of the invention as set forth in the appended claims.

What is claimed is:

1. An electrical circuit apparatus for use in electronic music generation comprising:

means for providing an electrical input signal of complex waveform carrying a fundamental frequency component;

means for converting said input signal to a signal bearing successive indications of the occurrence of a periodic reference point of the fundamental frequency component of said input signal;

period-to-voltage converter means responsive to said indications of the converted input signal, for repeatedly generating an analog voltage level, each said analog voltage level having a magnitude representative of the period between successive reference points; and output means for producing a signal output having a signal level magnitude determined by a said analog voltage level, said output means making a determination of the relative difference of the signal level magnitudes of successive analog voltage levels generated by said period-to-voltage converter means, and said output means updating said signal output in response to said determination.

2. Apparatus according to claim 1 wherein said periodic reference point occurs in each cycle of the fundamental frequency.

3. An electrical circuit apparatus according to claim 1, wherein said output means maintains said signal output when the relative difference in magnitudes of successive analog voltage levels exceeds a certain threshold difference.

4. An electrical circuit apparatus according to claim 1, wherein said output means determines whether the relative magnitudes of said successive analog voltage levels are within a predetermined range difference.

5. An electrical circuit apparatus according to claim 4, wherein said output means determines whether the magnitudes of said successive analog voltage levels are a certain percentage of one another.

6. Apparatus according to claim 1 wherein said converting means includes peak picker means for detecting the highest peak in each cycle of the fundamental frequency component of the input signal, said peak picker means generating an electrical signal bearing an indication of a said detected peak substantially in time with said peak of said input signal.

7. Apparatus according to claim 6 wherein said peak picker means includes means for sharpening the highest peaks and depressing lower peaks in each cycle of the fundamental frequency component.

8. An electrical circuit apparatus for use in electronic music generation comprising:

means for providing an electrical input signal of complex waveform carrying a fundamental frequency component;

means for converting said input signal to a signal bearing successive indications of the occurrence of a periodic reference point of the fundamental frequency component of said input signal, said periodic reference point occurring in each cycle of the fundamental frequency;

period-to-voltage converter means responsive to said indications of the converted input signal, for repeatedly generating an analog voltage level, each said analog voltage level having a magnitude representative of the period between successive reference points; and output means for producing a signal output having a magnitude determined by a said analog voltage level, said output means making a determination of the relative difference of the magnitudes of successive analog voltage levels generated by said period-to-voltage converter means, for updating said signal output in response to said determination, said output means including:

(i) store means for storing a voltage level generated by said period-to-voltage converter means and for providing the stored analog voltage level as said signal output; and (ii) correlation means for determining the relative difference in the magnitudes of successive analog voltage levels generated by said period-to-voltage converter means, for updating the analog voltage levels stored in said store means.

9. Apparatus according to claim 8 wherein said correlation means controls the initial storage of an analog voltage level in said store means.

10. Apparatus according to claim 9 wherein said output means includes a first storage device for storing a first analog voltage level generated by said period-to-voltage converter means during one cycle; a second storage device for storing a second voltage level generated by said period-to-voltage converter means during a cycle following said one cycle; and wherein said correlation means compares the magnitudes of said first and said second analog voltage levels; and update means responsive to said correlation means, for updating said stored analog voltage level.

11. Apparatus according to claim 10 wherein said update means commands storage of said second analog voltage level in said store means.

12. An electrical circuit apparatus for use in electronic music generation comprising:

input means for providing an electrical input signal of complex waveform carrying a fundamental frequency component;

peak picker means for converting said input signal to a signal of successive signal peaks occurring substantially in synchronism with the peaks of the fundamental frequency component of said input signal, said peak picker means monitoring the rate of change of the waveform of said input signal for detection of peaks in said waveform, said peak picker means sharpening the highest detected peaks and depressing the lower detected peaks in each cycle of the fundamental frequency component;

period-to-voltage converter means responsive to said signal peaks of the converter input signal, for repeatedly generating an analog voltage level, each said analog voltage level having a magnitude representative of the period between successive peaks of the fundamental frequency component; and output means connected to said period-to-voltage converter means, for producing a signal output having a signal level magnitude determined by a said analog voltage level, said output means for making a determination of the relative difference of the signal level magnitudes of successive analog voltage levels generated by said period-to-voltage converter means, and said output means updating said signal output responsive to said determination.

13. Apparatus according to claim 12 wherein said peak picker means includes:

operational amplifier means;

a capacitive path connecting said input means to the inverting input of said operational amplifier means; and a resistive feedback path connecting the output of said operational amplifier to its inverting input.

14. Apparatus according to claim 13 wherein said resistive feed back path includes a diode for passing negative valued current from the output of said operational amplifier means to said inverting input; and wherein said peak picker means includes a diode feedback path connecting the output of said operational amplifier to its inverting input, said diode feedback path passing positive valued current from the output of said operational amplifier means to said inverting input.

15. Apparatus according to claim 14 and further including: capacitor means connected to said resistive feedback path for charging from current flowing from said operational amplifier means; and signal output means producing an output signal substantially proportional to the magnitude of current charging said capacitor means.

16. An electronic music generator comprising:

transducer means for transducing a musical input signal to an electrical signal of complex waveform carrying a fundamental frequency component;

means for converting said electrical signal to a signal bearing successive indications of the occurrence of a periodic reference point of the fundamental frequency component of said input signal;

period-to-voltage converter means responsive to said indications of the converted electrical signal, for repeatedly generating an analog voltage level, each said analog voltage level having a magnitude representative of the period between successive reference points;

output means for producing a signal output having a signal level magnitude determined by a said analog voltage level, said output means making a determination of the relative difference of the signal level magnitudes of successive analog voltage levels generated by said period-to-voltage converter means, and said output means updating said signal output in response to said determination; and sound producer means responsive to said signal output for producing a sound output at a frequency represented by the magnitude of said signal output.

17. An electrical circuit apparatus for use in electronic music generation comprising:

means for providing an electrical input signal of complex waveform carrying a fundamental frequency component;

means for converting said input signal to an electrical signal bearing successive indications of the occurrence of a periodic reference point of the fundamental frequency component of said input signal, said converting means including peak picker means for detecting the highest peak in each cycle of the fundamental frequency component of said input signal, said peak picker means generating said electrical signal bearing an indication of a said detected peak substantially in time with said peak of said input signal, said peak picker means further including:

a plurality of peak pickers connected in cascade, each said peak picker having an input and an output, each said peak picker for detecting the highest peak in each cycle of the fundamental frequency component of a signal appearing at its input, each said peak picker generating at its output an electrical signal bearing an indication of a detected peak substantially in time with said peak of the signal appearing at its said input, the first of said plurality of peak pickers receiving said input signal, the last of said peak pickers transmitting at its output said electrical signal, and the remaining outputs of said peak pickers connected to the input of a following peak picker to connect said plurality in cascade;

period-to-voltage converter means connected to said converting means for receiving said electrical signal and being responsive to said indications of said electrical signal, for repeatedly generating an analog voltage level, each said analog voltage level having a magnitude representative of the period between successive reference points; and output means for producing a signal output having a magnitude determined by a said analog voltage level, said output means making a determination of the relative difference of the magnitudes of successive analog voltage levels generated by said period-to-voltage converter means, for updating said signal output in response to said determination.

* * * * *